US009012790B2

(12) United States Patent
Shrum, Jr. et al.

(10) Patent No.: US 9,012,790 B2
(45) Date of Patent: *Apr. 21, 2015

(54) SECURED BROADBAND DEVICE (71) Applicant: Cox Communications, Inc., Atlanta, GA (US)

(72) Inventors: Edgar V. Shrum, Jr., Atlanta, GA (US); Francisco Gonzalez, Atlanta, GA (US); John Civiletto, Atlanta, GA (US)

(73) Assignee: Cox Communications, Inc., Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/147,155

(22) Filed: Jan. 3, 2014

(65) Prior Publication Data

US 2014/0116772 A1    May 1, 2014

Related U.S. Application Data (63) Continuation of application No. 12/833,109, filed on Jul. 9, 2010, now Pat. No. 8,644,774.

(51) Int. Cl.
*H05K 5/02* (2006.01)
*H04L 12/28* (2006.01)

(52) U.S. Cl.
CPC .......... *H05K 5/0221* (2013.01); *H04L 12/2801* (2013.01); *H04L 12/2834* (2013.01); *H04L 12/2838* (2013.01); *H04L 12/2898* (2013.01)

(58) Field of Classification Search
CPC ............. H05K 5/0221; H04L 12/2801; H04L 12/2834; H04L 12/2898; H04L 12/2838
USPC .......... 455/90.3, 41.2, 3.06, 556.2, 557, 3.02; 174/520
See application file for complete search history.

(56) References Cited

U.S. PATENT DOCUMENTS

| | | | | |
|---|---|---|---|---|
| 7,676,194 B2* | 3/2010 | Rappaport | .................... | 455/11.1 |
| 7,983,613 B2* | 7/2011 | Rappaport | .................... | 455/11.1 |
| 8,175,104 B2* | 5/2012 | Connelly et al. | .............. | 370/401 |
| 8,209,400 B2* | 6/2012 | Baum et al. | ................. | 709/218 |
| 8,457,797 B2* | 6/2013 | Imes et al. | .................... | 700/276 |
| 8,626,349 B2* | 1/2014 | Stanczak et al. | .............. | 700/286 |
| 8,644,774 B2* | 2/2014 | Shrum et al. | ................. | 455/90.3 |
| 2009/0255725 A1* | 10/2009 | Curtis | .......................... | 174/535 |

\* cited by examiner

*Primary Examiner* — Marceau Milord (74) *Attorney, Agent, or Firm* — Sutherland Asbill & Brennan LLP (57) ABSTRACT Secured broadband devices and methods for providing broadband communication are provided. A broadband device may include a housing, at least one broadband component, and a securing mechanism. The at least one broadband component may be situated within the housing and configured to receive a broadband signal. Additionally, the at least one broadband component may be configured to output at least a portion of the broadband signal for receipt by one or more external devices. The securing mechanism configured to secure the housing to an electrical outlet.

20 Claims, 4 Drawing Sheets

SECURED BROADBAND DEVICE

CROSS-REFERENCE TO RELATED APPLICATION

The present application is a continuation application of U.S. application Ser. No. 12/833,109, filed Jul. 9, 2010, which is hereby incorporated by reference in its entirety as if fully set forth herein.

FIELD OF THE INVENTION

Aspects of the invention relate generally to broadband devices, and more particularly, to broadband devices that may be secured to an electrical outlet.

BACKGROUND OF THE INVENTION

Broadband service providers, such as cable service providers and satellite service providers, typically communicate one or more broadband signals and/or other signals to any number of households. These communicated signals may provide any number of services, such as television service, telephone service, Internet service, etc. A signal is typically communicated from outside of a household to a broadband device, such as a broadband modem or broadband router, situated within the household. For example, a cable drop or line may be extended into a household, and signals communicated via the drop may be received and processed by one or more gateway devices situated within the household.

In many situations, a broadband device situated within a household may be provided to a customer by a broadband service provider. Accordingly, the customer may remove the broadband device when the customer moves. This removal often results in increased equipment cost on the part of the broadband service provider. Therefore, broadband devices that may be secured within a household are desirable.

BRIEF DESCRIPTION OF THE INVENTION

Some or all of the above needs and/or problems may be addressed by certain embodiments of the invention. Embodiments of the invention may include broadband devices and associated methods for providing broadband communication. In one embodiment, a broadband device may be provided. The broadband device may include a housing, at least one broadband component, and a securing mechanism. The at least one broadband component may be situated within the housing and configured to receive a broadband signal. Additionally, the at least one broadband component may be configured to output at least a portion of the broadband signal for receipt by one or more external devices. The securing mechanism may be configured to secure the housing to an electrical outlet.

In accordance with another embodiment of the invention, a method for providing broadband communication is disclosed. A broadband device may be provided. The broadband device may include a housing that includes an electrical plug configured to be inserted into a corresponding receptacle of an electrical outlet. The broadband device may further include at least one broadband component situated within the housing. The at least one broadband component may be configured to receive a broadband signal and output the broadband signal for receipt by one or more external devices. The housing may then be secured to the electrical outlet.

In accordance with another embodiment of the invention, a broadband device may be provided. The broadband device may include a housing, at least one electrical plug, a termination component, at least one broadband component, and a securing mechanism. The at least one electrical plug may be configured to be inserted into a corresponding receptacle of an electrical outlet. The termination component may be configured to receive a broadband signal from an external source. The at least one broadband component may be situated within the housing and configured to receive at least a portion of the broadband signal. The securing mechanism may be configured to secure the housing to the electrical outlet.

Additional systems, methods, apparatus, features, and aspects may be realized through the techniques of various embodiments of the invention. Other embodiments and aspects of the invention are described in detail herein with reference to the description and to the drawings and are considered a part of the claimed invention.

BRIEF DESCRIPTION OF THE DRAWINGS

Reference will now be made to the accompanying drawings, which are not necessarily drawn to scale, and wherein.

DETAILED DESCRIPTION

Embodiments of the invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Embodiments of the invention may include broadband devices and associated methods for providing broadband communication. In certain embodiments, a broadband device configured to be secured within a household may be provided. The broadband component may include a housing, at least one broadband component situated within the housing, and a suitable securing mechanism that is configured to secure the broadband device. A wide variety of different broadband components may be situated within the housing as desired in various embodiments, such as a broadband modem, a router, and/or a network bridging device. A broadband component may be configured to receive a broadband signal and output at least a portion of the broadband signal for receipt by one or more external devices. For example, a broadband modem may be configured to receive a broadband signal and output at least a portion of the received broadband signal for receipt by an external router, an external set-top box, etc. As desired, any number of terminal or signal outputs may be incorporated into the broadband device to facilitate the output of at least a portion of the broadband signal. Additionally, in certain embodiments, the at least one broadband component may include a wireless router that is configured to output a wireless signal that includes at least a portion of the data contained within a received broadband signal. As desired, the broadband device may include a termination component, such as a radio frequency ("RF") terminator or a coaxial cable terminator, that is configured to receive the broadband signal from an external source, such as a cable feeder, a cable drop, or a satellite dish. The termination component may receive the broadband signal and provide the broadband signal to at least one broadband component.

The securing mechanism may be configured to secure the housing of the broadband device within a household. In certain embodiments, the securing mechanism may be configured to secure the housing to an electrical outlet. A wide variety of suitable securing mechanisms may be utilized as desired in various embodiments of the invention, for example, one or more tamper resistant screws or one or more screws that may only be accessed via a lockable panel. As desired, the broadband device may further include an electrical plug component that is configured to be inserted into a corresponding receptacle of the electrical outlet. In this regard, power for certain components of the broadband device (e.g., the broadband components) may be supplied by the electrical outlet. Additionally, in certain embodiments, the broadband device may include one or more electrical extender outlets situated on one or more faces of the housing. Each of the extender outlets may be configured to receive power from the electrical outlet, and supply at least a portion of the received power to a device that is plugged into the extender outlet. Accordingly, even if the broadband device utilizes a receptacle of the electrical outlet, the broadband device may provide additional receptacles that may be utilized to power other devices. Additionally, in certain embodiments, the broadband device may include one or more batteries that are configured to supply power to one or more components of the broadband device. For example, the batteries may be utilized to supply power if a loss of power event between the broadband device and the electrical outlet is detected.

As a result of securing the broadband device utilizing the securing mechanism, a customer or user of the broadband device, (e.g., a customer of a cable service provider, satellite service provider, etc.) may be discouraged from or prevented from removing the broadband device. For example, a customer may not be able to take the broadband device with them during a move to a new household. In this regard, the service provider may prevent or limit the loss of equipment.

For purposes of this disclosure, the term "household" refers to any residential unit or business establishment that may be provided with broadband communication service, including but not limited to, houses, apartment units, condominium units, small businesses, etc. A broadband device in accordance with an embodiment of the invention may be situated within a household.

Figure 1:
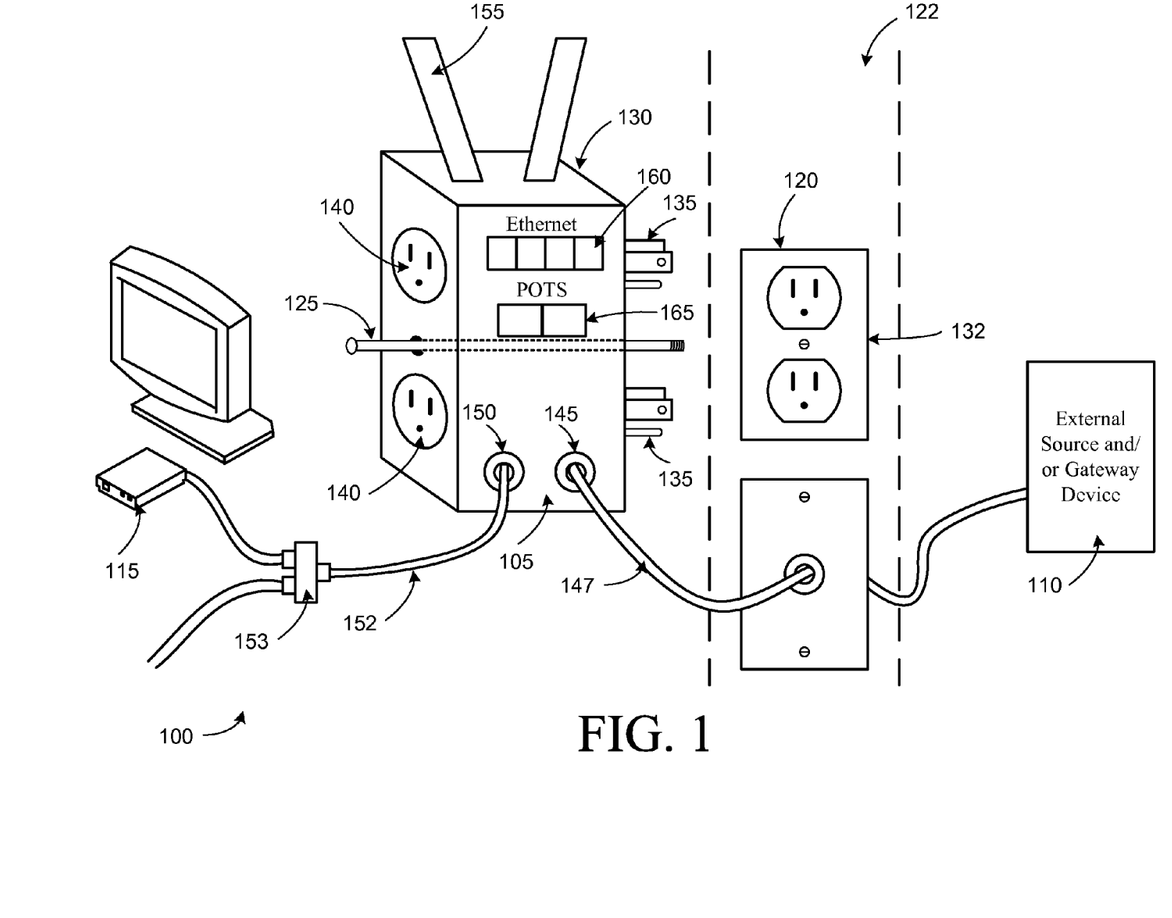
FIG. 1 illustrates a block diagram of an example system for providing a secured broadband device, according to an example embodiment of the invention.

FIG. 1 illustrates a block diagram of an example system 100 for providing a secured broadband device, according to an example embodiment of the invention. The system 100 may include a broadband device 105 that is configured to receive a broadband signal from an external gateway device 110 or an external source. The broadband device may further be configured to output at least a portion of the received broadband signal for receipt by one or more suitable external devices, such as a set-top box ("STB") 115. In certain embodiments, the broadband device 105 may include one or more broadband components that are configured to receive and process at least a portion of the broadband signal. These broadband component(s) may then output at least a portion of the broadband signal. One example of the broadband components that may be included in or incorporated into the broadband device 105 is described in greater detail below with reference to FIG. 3.

According to an aspect of the invention, the broadband device 105 may be secured within a household. For example, the broadband device may be secured to a wall or to another relatively permanent structure and/or device within the household. In this regard, a service provider (e.g., cable provider, satellite provider, etc.) that provides the broadband device to a consumer or customer may limit or prevent the removal of the broadband device from the household. In certain embodiments, the broadband device 105 may be secured to an electrical outlet 120, such as an electrical outlet situated within a wall 122 of the household. For example, a suitable securing mechanism or securing component may be utilized to secure the broadband device 105 to the electrical outlet 120. The securing mechanism may be utilized to fixidly secure or lock the broadband device 105 to the electrical outlet such that a consumer within the household is prevented or discouraged from moving or removing the broadband device. A wide variety of suitable securing mechanisms may be utilized as desired in various embodiments of the invention. For example, one or more tamper resistant screws 125, tamper resistant bolts, security screws and/or bolts, locking screws and/or bolts, and/or security fasteners may be utilized to secure a housing 130 of the broadband device 105 to the electrical outlet 120. As illustrated in FIG. 1, a tamper resistant screw 125 may extend through at least a portion of the housing 130 of the broadband device 105, through a faceplate 132 of the electrical outlet 120, and into an electrical box or housing associated with the electrical outlet 120. The appropriate screwdriver or other device that is capable of turning the screw 125 may be utilized by a service provider technician or employee to tighten or loosen the screw; however, a customer within the household may be prevented or discouraged from removing the screw 125 once it has been utilized to secure the broadband device 105 to the electrical outlet 120.

As another example of a securing mechanism, a suitable locking cover may be utilized to secure access to one or more screws or bolts that facilitate connection of the broadband device 105 to the electrical outlet 120. For example, a panel or other suitable cover may be positioned on the housing 130 over one or more screws that extend through the housing 130 and faceplate 132 and into an electrical box or housing associated with the electrical outlet 120. The panel may include a suitable lock or other locking device (e.g., a key lock) that limits access to the one or more screws. As desired, one or more hinges may be utilized to connect the panel to the housing 130. When the panel is removed or situated in an opened position, the one or more screws may be accessible. For example, when a technician having a key to the lock opens the panel, the technician may access the one or more screws such that the broadband device may be secured or unsecured from the electrical outlet 120. When the panel is in place or situated in a closed position, access to the one or more screws may be limited. In this regard, the broadband device 105 may be secured to the electrical outlet 120. An example of a broadband device that includes a locking panel is illustrated and described in greater detail below with reference to FIG. 2.

Other securing mechanisms may be utilized as desired in various embodiments of the invention to secure the broadband device 105 to an electrical outlet 120 or within a household. Additionally or alternatively, the broadband device 105 may be surface wall-mounted and/or secured within an attic or basement of a household. In yet other embodiments, the broadband device 105 may be installed inside of a wall within a household. For example, the broadband device 105 may be installed during construction of a home. Inside the wall, the broadband device 105 may be secured to an electrical outlet and/or to one or more studs within the wall. The securing mechanisms described above are provided by way of example only.

In certain embodiments of the invention, the broadband device 105 may include one or more electrical plugs 135, such as one or more male electrical plugs. The electrical plug(s) 135 may extend from the housing 130 of the broadband device 105 and be configured for insertion into a corresponding female outlet of the electrical outlet 120. For example, at least one electrical plug 135 may extend from a back or rear surface of the housing 130. When the electrical plug 135 is inserted into the electrical outlet 120, the back surface of the housing 130 may rest against the faceplate 132 of the electrical outlet 120. In this regard, one or more components of the broadband device 105 (e.g., one or more broadband components) may receive power from the electrical outlet 120. In certain embodiments, the broadband device 105 may be secured to the electrical outlet 120 following an insertion of the one or more electrical plugs 135 into corresponding receptacles of the electrical outlet 120. Additionally, the electrical plugs 135 may assist in securing the broadband device 105 to the electrical outlet 120.

As desired in certain embodiments, the broadband device 105 may additionally include one or more extender outlets 140. For example, one or more female extender outlets 140 may be situated on one or more faces of the housing 130, such as a front surface or side surface of the housing 130. Each extender outlet 140 may facilitate the provision of power to one or more external electrical devices that are plugged into the extender outlet 140. A power signal received from the electrical outlet 120 may be passed through the broadband device 105 to the extender outlets 140 utilizing any number of suitable wires and/or electrical components incorporated into the broadband device 105. In this regard, the broadband device 105 may provide a power signal to one or more other electrical devices. Accordingly, even though the broadband device 105 takes up at least a portion of the capacity of the electrical outlet 120, a consumer utilizing the broadband device 105 will not lose and may gain additional electrical outlet capacity.

Additionally, in certain embodiments, the broadband device 105 may include one or more components that are configured to detect a situation in which the broadband device 105 has been removed and/or disconnected from the electrical outlet 120, a wall, or other mounting surface. For example, the broadband device 105 may include one or more tamper switches, such as plunger tamper switches, that are configured to detect a removal situation for the broadband device 105. As desired, the tamper switches may be in communication with a suitable controller or control unit that is associated with the broadband device 105. Additionally, the broadband device 105 may be configured to take a wide variety of suitable control actions when a removal situation has been identified. For example, the broadband device 105 may trigger an alarm and/or communicate an alarm message to one or more remote devices, such as a cable plant. As another example, the broadband device 105 may discontinue the output of broadband services to one or more external devices situated within the household.

The housing 130 may be configured to contain one or more internal components of the broadband device 105, such as one or more broadband components, one or more controllers, and/or one or more power management components. Additionally, one or more terminators, electrical extender outlets, and/or electrical plugs may be situated on one or more external surfaces of the housing 130. The housing 130 may be formed from any number of suitable materials, such as plastics, composite materials, and/or other materials. Additionally, the housing 130 may be formed having any number of suitable dimensions as desired in various embodiments of the invention. As desired, the dimensions of the housing 130 may be determined based at least in part on the size of the components of the broadband device 105 situated within the housing 130 and/or on the surfaces of the housing 130.

The broadband device 105 may be configured to receive a broadband data signal from an external source 110, source, such as a cable drop, cable feeder, satellite dish, external gateway device, and/or other suitable gateway device. The broadband device 105 may include at least one suitable termination component 145 or terminator that facilitates receipt of the broadband signal by the broadband device 105. Once the broadband signal is received, the signal may be processed by one or more broadband components included in the broadband device 105, such as a broadband modem, a router, an embedded Multimedia Terminator Adaptor ("eMTA"), and/or a network bridging device. A portion or all of the broadband signal may then be output by the broadband device 105 for receipt by one or more external destination devices, such as a STB 115, a personal computer, a Voice over Internet Protocol ("VoIP") telephone, etc. For example, a portion of the broadband signal may be output by one or more output ports 150 and/or by one or more wireless transceivers 155 and/or antennas.

The termination component 145 may be configured to connect to a source of a broadband data signal and receive the signal from the source. For example, the termination component 145 may be configured to connect to a coaxial cable 147 or other suitable data line that is configured to directly or indirectly communicate a broadband data signal from an external gateway device 110 to the broadband device 105. A wide variety of suitable termination components 145 may be utilized as desired in various embodiments of the invention, such as a radio frequency ("RF") termination component or a RF coaxial termination component.

Once a broadband data signal is received by the termination component 145, the termination component may provide at least a portion of the received signal to one or more broadband components, such as a broadband modem, router, and/or network bridging device. These broadband components may process the received broadband signal and selectively output the broadband signal for receipt by one or more external destination devices (e.g., a STB, personal computer, etc.). One example of the broadband components that may be incorporated into the broadband device 105 is described in greater detail below with reference to FIG. 3.

As desired, the broadband device 105 may include one or more controllers or control units that facilitate control of the general operation of the broadband device 105 and/or the processing and selective output of the broadband data signal by the broadband components. In certain embodiments, a controller may be incorporated into a broadband component, such as a broadband modem. In other embodiments, a separate controller may be utilized. Additionally, as desired, control functions may be distributed among several controllers. A controller may be a suitable processor-driven or processor-based device, such as a computer, a digital assistant, a personal digital assistant, a digital tablet, an Internet appliance, an application specific circuit, a microcontroller, a minicomputer, or any other processor-based device. As desired, a controller may access and execute computer-readable or computer-implemented instructions. The execution of the computer-readable instructions by the controller may form a special purpose computer or other particular machine that is operable to control the operation of the broadband device 105 and/or the selective output of the broadband signal. In this regard, the controller may control the provision of one or more services to the household, such as a television service, a telephone service, an Internet service, a home monitoring service, a home security service, etc.

With continued reference to FIG. 1, the broadband device 105 may include one or more suitable output components that facilitate the output of at least a portion of the broadband data signal to an external destination device. For example, one or more output ports 150 may be situated on one or more external faces of the housing 130. Each port 150 may be configured to connect to a suitable output wire or output signal line, such as a coaxial cable 152, that is configured to communicate an output signal to a destination device, such as a STB 115, a computer, a VoIP telephone, etc. As desired, one or more suitable splitters 153 may be utilized to distribute an output signal to a plurality of destination devices. Additionally, as desired, the broadband device 105 may include any number of network interfaces and/or network ports, such as Ethernet ports 160, RJ-11 ports 165 that facilitate telephone service, category 5 ("CAT5") ports, RJ45 ports, and/or other ports that facilitate the output of communications signals to external devices. The various wiring connections that are made with the broadband device 105 (e.g., coaxial cable connections, Ethernet connections, etc.) may be secured as desired. For example, coaxial cable connections made to the broadband device 105 may be secured or locked in order to reduce or eliminate disconnection of the coaxial cables from the broadband device 105.

Additionally, in certain embodiments, the broadband device 105 may include one or more suitable wireless transceivers and/or wireless antennas that are configured to output a suitable wireless signal for receipt by an external destination device. For example, a wireless transceiver 155 in communication with a wireless router situated inside the broadband device 105 may be provided. A wide variety of wireless transceivers may be incorporated into the broadband device 105 as desired in various embodiments of the invention, such as a Wi-Fi transceiver, Bluetooth transceiver, etc.

Additionally, in certain embodiments, the controllers and/or one or more other components of the broadband device 105 (e.g., a modem, a router, etc.) may monitor one or more devices that are connected to and/or in communication with a network that is generated and/or managed by the broadband device 105. Various aspects of the broadband signal that is received by the broadband device 105 may also be monitored. As desired, a wide variety of monitoring data and/or status information may be provided to the network by the broadband device.

Figure 2:
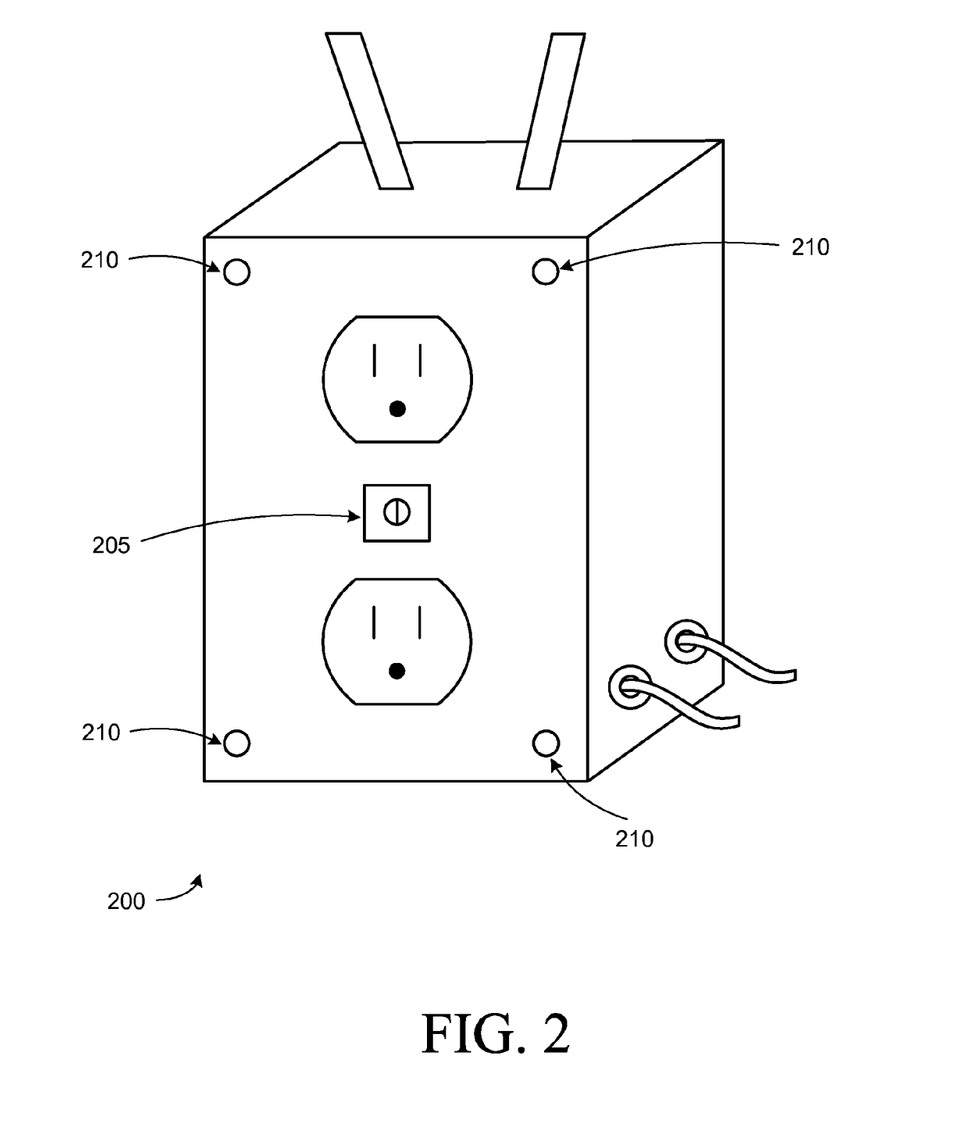
FIG. 2 illustrates a schematic diagram of an example broadband device that may be utilized in accordance with various embodiments of the invention.

FIG. 2 illustrates a schematic diagram of an example broadband device 200 that may be utilized in accordance with various embodiments of the invention. The broadband device 200 illustrated in FIG. 2 may be similar to the broadband device 105 illustrated in FIG. 1, and therefore, may include similar components. However, the broadband device 200 of FIG. 2 may include a lockable panel 205 as a security mechanism. The lockable panel may be removed or opened utilizing a suitable key. In this regard, one or more screws, bolts, or other fasteners that are utilized to secure the broadband device 200 to an electrical outlet may be accessed.

Additionally, the broadband device 200 may include one or more slots or openings 210 through which one or more respective screws, bolts, or other fasteners may be extended. These fasteners may be utilized to secure the broadband device 200 to the electrical outlet and/or to a wall in which the electrical outlet is situated. For example, one or more screws may be extended through the broadband device 200 and into a stud to which the electrical outlet is attached. In this regard, additional stability and/or support may be provided for the broadband device 200.

The broadband devices 105, 200 illustrated in FIGS. 1 and 2 are provided by way of example only. Any other suitable broadband devices with more or less than the components described in FIGS. 1 and 2 may be utilized as desired in various embodiments of the invention.

Figure 3:
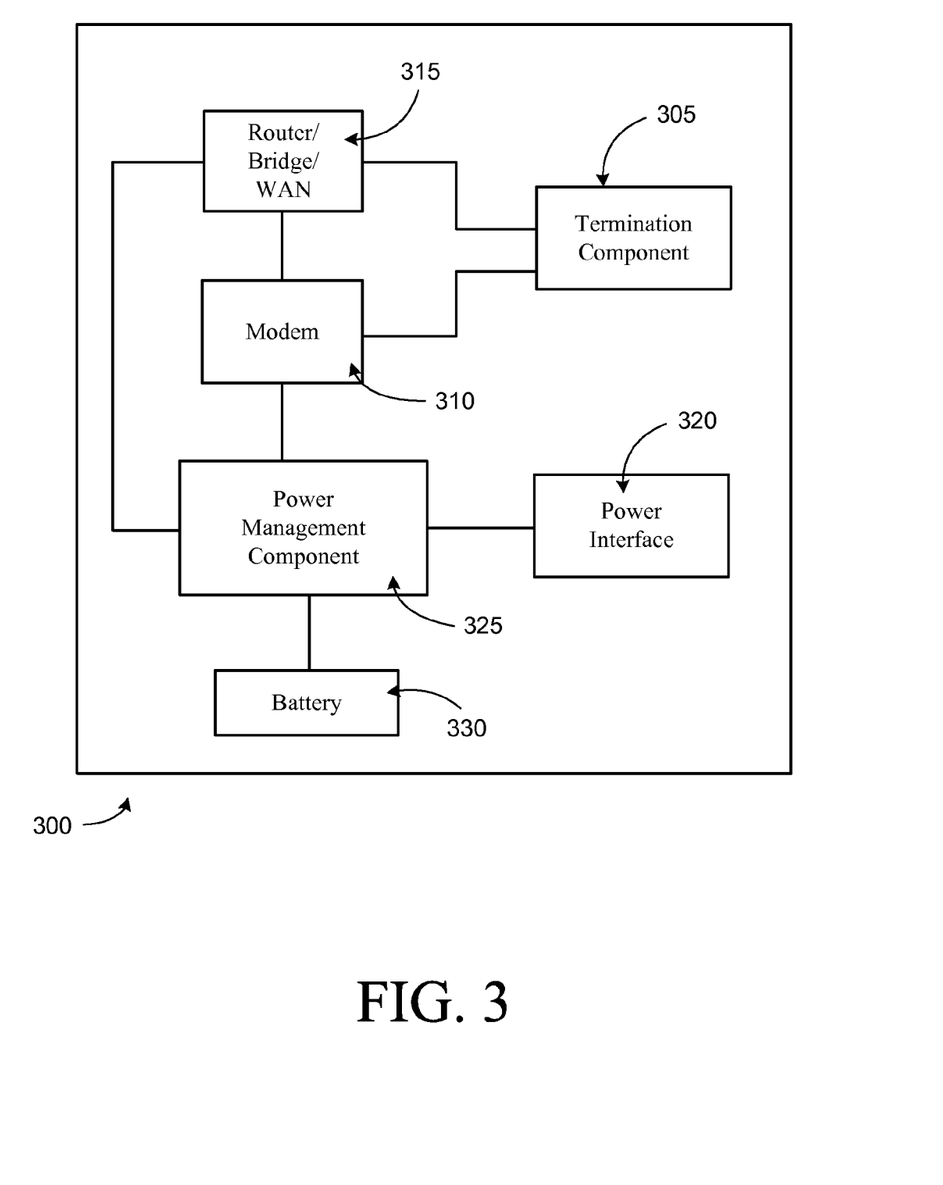
FIG. 3 illustrates a block diagram of the components of an example broadband device, according to an illustrative embodiment of the invention.

FIG. 3 illustrates a block diagram of the components of an example broadband device 300, according to an illustrative embodiment of the invention. The components illustrated in FIG. 3 may be example components of the broadband devices 105, 200 illustrated in FIGS. 1 and 2. With reference to FIG. 3, the broadband device 300 may include a termination component 305 and one or more broadband components that facilitate the output of a broadband signal by the broadband device, such as a broadband modem 310 and/or a router 315 or network bridge. Additionally, the broadband device 300 may include one or more power components, such as a power interface 320, a power management component 325 and/or one or more batteries 330.

The termination component 305 may be similar to the termination component 145 described above with reference to FIG. 1. The termination component 305 may facilitate the receipt of a broadband signal from an external source, such as an external gateway device. The termination component 305 may then provide at least a portion of the received broadband signal, such as the digital component(s) of the broadband signal, to one or more of the broadband components, such as the broadband modem 310 and/or the router 315. As desired, other components of the broadband signal, such as one or more analog components of the signal, unencrypted digital components of the signal (e.g., clear quadrature amplitude modulation ("QAM") components), and/or components of the signal that are encrypted for one way devices may be provided from the termination component 305 to one or more output ports associated with the broadband device 300 for provision to one or more external destination devices.

The modem 310 may be any suitable device that is configured to receive at least a portion of the broadband data signal from the termination component 305 and demodulate the received signal. Additionally, the modem may be configured to selectively output the broadband data signal and/or portions of the broadband data signal for receipt by one or more external devices. As desired, the modem 310 may be capable of providing a wide variety of services to a household, such as television service, Internet service, Voice over Internet Protocol ("VoIP") telephone service, home monitoring services, etc. In certain embodiments, the modem 310 may divide and/or filter the received signal into one or more frequency bands associated with different services. Additionally, as desired, the modem 310 may selectively decrypt the received signal.

A wide variety of different types of broadband modems may be utilized as desired in various embodiments of the invention, including but not limited to, cable modems, digital subscriber line ("DSL") modems, or passive optical network ("PON") modems. Additionally, in certain embodiments, the modem 310 or a suitable controller associated with the broadband device 300 may control the output of signals that are not processed by the modem 310, such as analog signals, clear QAM signals, etc., to one or more external destination devices. For example, the modem 310 may control the positioning and/or actuation of one or more switches that facilitate the communication of an analog signal from the termination component 305 to an output port. In this regard, if the household is not authorized to receive an analog signal, then the modem 310 may prevent the signal from being provided to the household. Accordingly, any number of services (e.g., analog services, clear QAM services, digital services, etc.) may be selectively activated and deactivated for the household by the modem 310. In certain embodiments, control signals and/or configuration files may be uploaded or otherwise communicated to the modem 310 from an external source, and the modem 310 may utilize the received information to selectively control the provision of services to the household. Accordingly, it is not necessary to dispatch a service technician to the household in order to activate or deactivate services.

With continued reference to FIG. 3, the router 315 may receive the broadband data signal (or a portion thereof) from the modem 310, and the router 315 may output the broadband data signal for receipt by one or more external devices situated within the household. The router 315 may be a specialized computer or computing component that facilitates the receipt of information from the modem 310 and the forwarding of received information to household devices. In certain embodiments, the router 315 may receive, from the modem 310, only a portion of the broadband data signal that the household, a device situated within the household, and/or a user in the household, is authorized to receive. In other embodiments, the router 315 may receive one or more control signals from the modem 310, and the router 315 may selectively output portions of the broadband data signal to the household devices based upon the control signals.

A wide variety of suitable routers may be utilized as desired in various embodiments of the invention. In operation, the router 315 may output a signal for receipt by one or more external devices via a local area network ("LAN") that is formed by and/or maintained by the router 315. In certain embodiments, the router 315 may be a router that includes one or more Multimedia over Coax Alliance ("MoCA") interfaces, although other interfaces, standards, and/or technologies may be utilized, including but not limited to, Ethernet, Powerline, G.hn, etc. Utilizing MoCA interfaces, one or more MoCA signals may be output by the router 315 for communication to household devices. A MoCA signal may be a signal that is allowed to be communicated to an external device; however, the MoCA signal may be filtered by the router 315 and/or any number of suitable MoCA filters or point of entry ("POE") filters in order to prevent leakage of the MoCA signal through the termination component 305 to the source.

As desired, the router 315 may include a wireless output component, such as a wireless transceiver. For example, the router 315 may form a wireless access point that facilitates access to broadband communication via any number of wireless devices or Wi-Fi devices. In certain embodiments, devices that are permitted to access certain portions of the broadband signal, such as mobile devices and/or computers situated within the household, may be configured to receive a wireless signal from the router 315.

As an alternative to or in addition to including a router 315, a network bridging device and/or a wide area network ("WAN") interface device may be incorporated into broadband device 300. Similar to a router, a bridging device or WAN interface may facilitate communication between the broadband device 300 and one or more external devices.

As desired, the broadband device 300 may include an embedded Multimedia Terminator Adaptor ("eMTA"). For example, in embodiments in which the modem 310 is a cable modem, an eMTA may be provided in order to extend the functionality of the modem to provide telephone service to the household. The eMTA may facilitate the provision of Voice over Internet Protocol ("VoIP") telephony to the household. VoIP services may be provided to the household via a LAN and/or via any number of suitable plain old telephone service ("POTS") ports associated with the broadband device 300. With other types of modems (e.g., DSL modems, PON modems, etc.), other suitable devices and/or components that are similar to the eMTA may be provided in the broadband device 300 to facilitate the provision of telephone service.

In certain embodiments, one or more controllers or control units may be incorporated into the broadband device. As desired, at least one controller may be incorporated into another component of the broadband device 300. For example, a controller may be incorporated into the modem 310. The controller may be any suitable processor-driven device that facilitates control of the general operation of the broadband device 300. Examples of suitable processor-driven devices include, but are not limited to, a personal computer, a digital assistant, a personal digital assistant, a digital tablet, an Internet appliance, an application specific circuit, a microcontroller, a minicomputer, or any other processor-based device. As desired, the controller may access and execute computer-readable or computer-implemented instructions. The execution of the computer-readable instructions by the controller may form a special purpose computer or other particular machine that is operable to control the operation of the broadband device 300 and/or the provision of services to the household. Additionally, in certain embodiments of the invention, the operations and/or control of the broadband device may be distributed among several processing components.

As desired, the controller may include any number of computing processors, memory devices (e.g., caches, read-only memory devices, random access memory devices, magnetic storage devices, etc.), input/output ("I/O") interface(s), and network interface(s). The memory devices may store data, executable instructions, and/or various program modules utilized by the controller, for example, data files, an operating system ("OS"), and a service application. The data files may include any suitable data that facilitates the operation of the broadband device 300 and/or the provision of broadband communication and/or other services to the household. For example, the data files may include, but are not limited to, a customer profile for the household, customer profiles for various devices situated within the household, customer profiles for various individuals and/or users within the household, information associated with activated or enabled services, usage information, monitoring information, etc. The OS may be a suitable software module that controls the general operation of the controller. The OS may also facilitate the execution of other software modules, such as a service application.

The service application or service module may be utilized to control the provision of services to the household. For example, the service application may identify one or more services that should be provided to the household (e.g., telephone service, Internet service, television service, premium television service, certain channels, etc.) or to one or more devices within the household. A wide variety of information may be utilized as desired to determine which services should be provided, including but not limited to, stored customer profile information, authorization information received from the source, and/or authorization information (e.g., identifier, password, credentials, etc.) received from a device situated within the household. Once the service application has identified one or more services that should be provided to the household, the service application may control the output of portions of the broadband signal by the modem 310 and/or router 315. In certain embodiments of the invention, devices situated within the household may be individually addressable, thereby facilitating control over services and/or broadband communications that are provided by the broadband device 300.

The one or more I/O interfaces may facilitate communication between the controller and one or more input/output devices, for example, one or more user interface devices, such as a display, keypad, control panel, touch screen display, etc., that facilitate user interaction with the controller. The one or more network interfaces may facilitate connection of the controller to one or more suitable networks, for example, a local area network that facilitates communication between various components of the broadband device 300.

With continued reference to FIG. 3, the power interface 320 may be configured to receive power from an electrical outlet to which the broadband device 300 is secured. For example, an electrical plug associated with the broadband device 300 may receive a power signal from the electrical outlet, and the power interface 320 may receive the power signal from the electrical plug. A suitable power management component 325 or power distribution component may then control the distribution of the received power signal to one or more other components of the broadband device 300, such as the modem 310 and/or the router 315. Additionally, as desired, the power management component 325 may facilitate the provision of the power signal to one or more extender outlets associated with the broadband device 300.

Additionally, in certain embodiments of the invention, one or more batteries 330 may be incorporated into the broadband device 300. As desired, the batteries 330 may be charged by the power management component 325. The batteries 330 may be configured to provide power to one or more components of the broadband device 300 during a loss of power event. For example, if a power outage in the electrical outlet occurs, then the batteries 330 may be utilized to power components of the broadband device 300. Additionally, as desired, during a power outage event, the operation of one or more of the broadband components 310, 315 may be adjusted or changed to a relatively low power mode. In the relatively low power mode, relatively limited services may be provided to the household. For example, emergency telephone service may be provided while other services, such as television service and/or Internet service, are not provided by the broadband device 300.

The broadband device 300 may include any number of other components as desired in various embodiments of the invention. The components illustrated in FIG. 3 are provided by way of example only.

Figure 4:
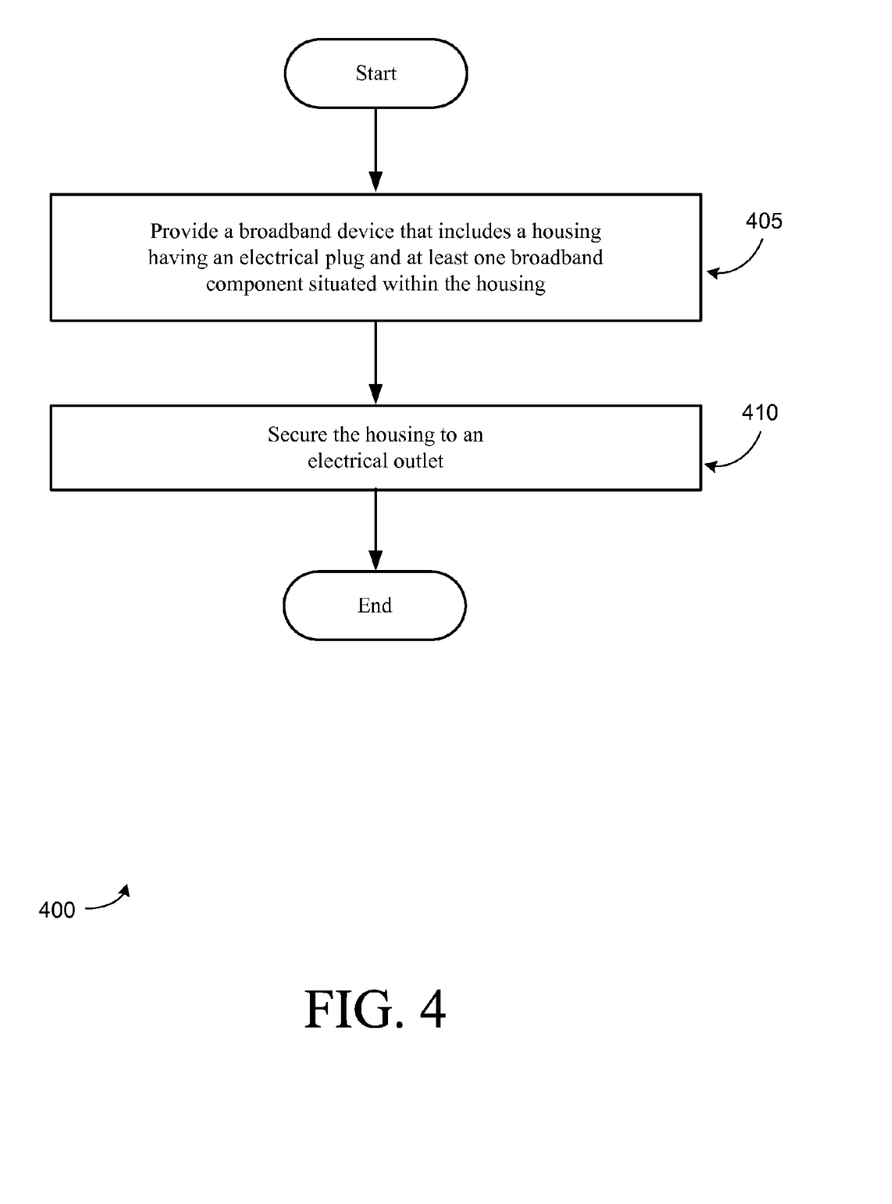
FIG. 4 is a flow diagram of an example method for providing a secured broadband device, according to an illustrative embodiment of the invention.

FIG. 4 is a flow diagram of an example method 400 for providing a secured broadband device, according to an illustrative embodiment of the invention. The method 400 may be utilized to secure a broadband device, such as the broadband devices 105, 200 illustrated in FIGS. 1 and 2, to an electrical outlet. The method 400 may begin at block 405.

At block 405, a broadband device may be provided. The broadband device may include a housing and one or more broadband components. The broadband device may be configured to provide one or more broadband services, such as television, Internet, telephone, and/or security services, to a household. The housing may be configured to contain or house any number of other components of the broadband device, such as one or more suitable broadband components. Additionally, the housing may include at least one electrical plug. The electrical plug may extend from a face or surface of the housing, and the electrical plug may be configured to be inserted into a corresponding receptacle of an electrical outlet.

The at least one broadband component may be situated within the housing. The broadband component(s) may be configured to receive a broadband signal from a source and/or a termination component. The broadband component(s) may further be configured to process the received broadband signal, and output at least a portion of the broadband signal for communication to and/or receipt by one or more external devices situated within the household, such as a STB, a computer, a VoIP telephone, etc. A wide variety of suitable broadband components may be situated within the housing as desired in various embodiments, such as a broadband modem, a router, and/or a network bridging device.

At block 410, the housing may be secured to an electrical outlet. For example, the housing may be positioned in proximity to the electrical outlet. As desired, the electrical plug may be inserted into the electrical outlet. A suitable securing mechanism, such as a tamper resistant screw, may then be utilized to secure the housing to the electrical outlet. For example, a tamper resistant screw may be extended through the housing of the broadband device, through a faceplate of the electrical outlet, and into an electrical box associated with the electrical outlet. In this regard, the broadband device may be securely connected to the electrical outlet. This secure connection may prevent and/or limit removal of the broadband device from the household in which the broadband device is utilized.

The method 400 may end following block 410.

The operations described and shown in the method 400 of FIG. 4 may be carried out or performed in any suitable order as desired in various embodiments of the invention. Additionally, in certain embodiments, at least a portion of the operations may be carried out in parallel. Furthermore, in certain embodiments, less than or more than the operations described in FIG. 4 may be performed. For example, various wiring connections may be made to facilitate connection of the broadband device to a source of a broadband signal and/or to one or more external devices situated within the household.

Many modifications and other embodiments of the invention set forth herein will be apparent having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A broadband device, comprising:
    a housing comprising an electrical plug configured to be inserted into a corresponding receptacle of an electrical outlet;
    at least one broadband component situated within the housing and configured to receive a broadband signal and output at least a portion of the broadband signal for receipt by one or more external devices;
    a securing mechanism that couples the housing to the electrical outlet following an insertion of the electrical plug into the corresponding receptacle; and
    a locking mechanism coupled to the housing, wherein the locking mechanism prevents actuation of the securing mechanism.

2. The broadband device of claim 1, wherein the locking mechanism is coupled to the housing by one or more hinges that allow the locking mechanism to move about a rotatable axis.

3. The broadband device of claim 1, wherein the locking mechanism prevents access to the securing mechanism.

4. The broadband device of claim 1, wherein the securing mechanism comprises a tamper resistant screw.

5. The broadband device of claim 1, wherein the at least one broadband component comprises at least one of (i) a broadband modem, (ii) a router, or (iii) a network bridging device.

6. A broadband device comprising:
    a housing comprising an electrical plug configured to be inserted into a corresponding receptacle of an electrical outlet;
    at least one broadband component situated within the housing and configured to receive a broadband signal and output at least a portion of the broadband signal for receipt by one or more external devices;
    a securing mechanism that couples the housing to at least one of the electrical outlet or a structural surface associated with the electrical outlet following insertion of the electrical plug into the corresponding receptacle; and
    a switch within the housing, the switch configured to detect removal of the broadband device from the electrical outlet or the structural surface.

7. The broadband device of claim 6, further comprising:
    a controller, the controller configured to receive, from the switch, an indication that the broadband device has been removed from the electrical outlet or the structural surface, and perform one or more actions in response to receiving the indication.

8. The broadband device of claim 7, wherein the one or more actions comprise at least one of (i) communicating an alarm message to one or more remote devices or (ii) discontinuing the output of at least a portion of the broadband signal for receipt by the one or more external devices.

9. The broadband device of claim 6, wherein the switch comprises a tamper switch.

10. The broadband device of claim 6, wherein the structural surface is a wall.

11. The broadband device of claim 6, further comprising:
    a locking mechanism coupled to the housing, wherein the locking mechanism prevents actuation of the securing mechanism.

12. The broadband device of claim 11, wherein the locking mechanism prevents access to the securing mechanism.

13. The broadband device of claim 11, wherein the securing mechanism comprises at least one of a screw or a bolt.

14. A method comprising:
    receiving, by a broadband device, an indication that the broadband device was removed from an electrical outlet to which the broadband device was previously secured using a receptacle of the electrical outlet, wherein the indication is received from a switch within the broadband device that is configured to detect the removal;
    communicating, by the broadband device based at least in part on the indication, an alarm message to a remote device;
    receiving, from the remote device, a broadband signal comprising data for receipt by one or more external devices; and
    discontinuing, by the broadband device based at least in part on the alarm message, output of at least a portion of the broadband signal for receipt by the one or more external devices.

15. The method of claim 14, wherein the broadband device is situated within a housing, and wherein the broadband device is coupled to the electrical outlet following an insertion of an electrical plug of the housing into the receptacle of the electrical outlet.

16. The method of claim 14, wherein the broadband device comprises:
    a housing, the housing comprising the electrical plug for inserting into the electrical outlet; and
    a locking mechanism coupled to the housing, wherein the locking mechanism prevents actuation of a securing mechanism that secures the housing to the electrical outlet.

17. The method of claim 16, wherein the securing mechanism comprises a tamper resistant screw.

18. The method of claim 14, wherein the at least a portion comprises at least a first portion, and wherein the method further comprises outputting, by the broadband device, at least a second portion of the received broadband signal to the one or more external devices.

19. The method of claim 18, wherein outputting the at least a second portion comprises outputting a wireless signal for receipt by the one or more external devices.

20. The method of claim 14, wherein the broadband device is situated within a housing, the housing comprising at least one output terminal configured to output at least a portion of the broadband signal.

* * * * *